(12) United States Patent
Kitazaki et al.

(10) Patent No.: US 9,560,740 B2
(45) Date of Patent: Jan. 31, 2017

(54) CIRCUIT MODULE AND METHOD OF MANUFACTURING SAME

(71) Applicant: TAIYO YUDEN CO., LTD., Tokyo (JP)

(72) Inventors: Kenzo Kitazaki, Tokyo (JP); Eiji Mugiya, Tokyo (JP); Masaya Shimamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/861,867

(22) Filed: Sep. 22, 2015

(65) Prior Publication Data

US 2016/0095267 A1 Mar. 31, 2016

(30) Foreign Application Priority Data

Sep. 30, 2014 (JP) .................. 2014-199714

(51) Int. Cl.
| | |
|---|---|
| *H05K 7/00* | (2006.01) |
| *H05K 1/02* | (2006.01) |
| *H05K 9/00* | (2006.01) |
| *H05K 3/28* | (2006.01) |
| *H05K 3/00* | (2006.01) |

(52) U.S. Cl.
CPC .......... *H05K 1/0216* (2013.01); *H05K 9/0024* (2013.01); *H05K 3/0052* (2013.01); *H05K 3/284* (2013.01); *H05K 2201/0715* (2013.01)

(58) Field of Classification Search
USPC ........................................ 361/760, 748, 807
See application file for complete search history.

(56) References Cited

U.S. PATENT DOCUMENTS

| | | | |
|---|---|---|---|
| 2010/0213620 A1* | 8/2010 | Hamada ............. | H01L 21/4846 257/786 |
| 2012/0000699 A1 | 1/2012 | Inoue | |
| 2012/0008288 A1 | 1/2012 | Tsukamoto et al. | |
| (Continued) | | | |

FOREIGN PATENT DOCUMENTS

| | | |
|---|---|---|
| JP | 2010-225620 A | 10/2010 |
| JP | 2012-019091 A | 1/2012 |
| (Continued) | | |

*Primary Examiner* — Andargie M Aychillhum
(74) *Attorney, Agent, or Firm* — Chen Yoshimura LLP

(57) ABSTRACT

A circuit module, including: a substrate having electronic components mounted thereon and further having a conductive pattern that defines respective shielded areas where the electronic components are mounted; a sealing layer covering the substrate and the electronic components, the sealing layer having grooves formed therein along the conductive pattern; and a conductive shield, including: a first shielding section covering a top surface of the sealing layer; a second shielding section covering side faces of the sealing layer; and a third shielding section filling the grooves in the sealing layer, wherein the grooves are shaped such that the third shielding section has at least one end thereof connected to the second shielding section, the third shielding section thereby acting as shielding walls partitioning the respective shielded areas, and that said at least one end of the third shielding section has a width wider than other portions of the third shielding section.

5 Claims, 12 Drawing Sheets

(56) References Cited

U.S. PATENT DOCUMENTS

2013/0301227 A1* 11/2013 Kawano ............... H01L 21/561
                                                        361/748
2015/0043170 A1   2/2015 Shimamura et al.
2015/0043189 A1   2/2015 Kitazaki et al.

FOREIGN PATENT DOCUMENTS

| JP | 5466785 B1 | 4/2014 |
| JP | 5576542 B1 | 8/2014 |

* cited by examiner

CIRCUIT MODULE AND METHOD OF MANUFACTURING SAME

BACKGROUND OF THE INVENTION

Technical Field

The present invention relates to a circuit module that has an electromagnetic shielding function and a method of manufacturing the same.

Background Art

There are well-known circuit modules in which a plurality of electronic components are mounted on a substrate and the modules are then mounted on various types of electronic devices. This type of circuit module generally has an electromagnetic shielding function that both prevents electromagnetic waves from leaking to the outside of the module and prevents electromagnetic waves from entering into the module from the exterior.

Moreover, as the electronic components mounted within the module have become more diverse along with higher functionality, there have been various techniques proposed for preventing electromagnetic interference among these electronic components. Patent Document 1 discloses a circuit module in which a slit that penetrates a mold resin layer to reach a circuit board is formed between two electronic components on the circuit board, and the slit is filled with a conductive resin, for example. Patent Document 2 discloses a module in which a conductive shielding wall is formed between circuit blocks via a plurality of conductive components mounted on the circuit board or via a conductive paste or conductive coating material used to fill grooves formed in a mold resin.

RELATED ART DOCUMENTS

Patent Documents

Patent Document 1: Japanese Patent Application Laid-Open Publication No. 2010-225620
Patent Document 2: Japanese Patent Application Laid-Open Publication No. 2012-019091
Patent Document 3: Japanese Patent No. 5466785
Patent Document 4: Japanese Patent No. 5576542

SUMMARY OF THE INVENTION

However, in the configuration disclosed in Patent Document 1, dicing is used to form the slits that penetrate the mold resin layer. Thus, the shape of the slits is limited to a straight line only, and cannot be curved or branched. The shape of the internal shield is therefore limited, and there are restrictions to the mounting layout of the components. Moreover, the depth of the slits cannot be precisely controlled when dicing is used; thus, it is difficult to have the bottom of the slit electrically contact the wiring directly below the slit.

On the other hand, in the configuration disclosed in Patent Document 2, a conductive shielding wall is formed via a plurality of conductive components mounted on a circuit board. As a result, production costs will increase as the number of components and the number of mounting steps increase.

Patent Document 2 also discloses that a groove filled with a conductive paste or a conductive coating material is formed via laser processing a mold resin. In this method, the groove is formed by adjusting the strength of the laser beam. If the laser beam is too strong, however, it is impossible to avoid damaging the wiring on the circuit board, and if the laser beam is too weak, efficiency decreases and productivity cannot be maintained. Thus, it can be difficult to set the laser to the optimal strength, which is a problem.

Therefore, Patent Document 3 discloses a method in which, by using a laser beam to form a groove (reference character 41 in Patent Document 3) and forming the groove along a conductive pattern, a shielding section (reference character 52 in Patent Document 3) is formed without burning a metal layer (reference character 11 in Patent Document 3).

Patent Document 4 discloses a circuit module that has a groove-shaped trench that recesses from the main surface of a sealing body toward a mounting surface, and the trench is formed so that both edges of the trench are shallower than the portion of the trench that extends between the edges (claim 5 of Patent document 4, for example). One of the advantages of the configuration disclosed in Patent Document 4 is that warping and deformation can be prevented.

However, there is a problem with the configuration disclosed in Patent Document 4 in that the shallow portions of the trench have a lower ability to block electromagnetic waves than the portion of the trench that is not shallow.

Another problem, which is not disclosed in the related art documents, is that the above-mentioned problems must be resolved while also making sure that when an internal shield partition is formed in the step before an aggregate substrate is individually divided (divided into individual components that are mounted in each of the individual modules), grooves created to form the internal shield partition do not extend beyond the pre-determined cut lines that will be used when the substrate is individually divided.

Accordingly, the present invention is directed to a scheme that substantially obviates one or more of the above-discussed and other problems due to limitations and disadvantages of the related art. With the above-mentioned situation in mind, an object of the present invention is to provide a circuit module that confers a high degree of design freedom for the shape of the shield; protects the wiring on the circuit board from the radiation of the laser beam; ensures an electrical connection between the wiring and the shield; and facilitates enhancement of shielding capabilities against electromagnetic waves and the like more than the configuration disclosed in Patent Document 4 while also suppressing warping and deformation. Additional problems and effects will be made clear in the detailed description of the invention that will be given later in this specification.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a circuit module, including: a substrate having a plurality of electronic components mounted thereon, the substrate further having a conductive pattern that defines respective shielded areas where the electronic components are mounted; a sealing layer covering the substrate and the electronic components, the sealing layer having grooves formed therein along the conductive pattern; and a conductive shield, including: a first shielding section covering a top surface of the sealing layer; a second shielding section covering side faces of the sealing layer; and a third shielding section filling the grooves in the sealing layer, wherein the grooves in the sealing layer are shaped such that the third shielding section has at least one end thereof connected to the second shielding section, the third shielding section thereby acting as shielding walls partitioning the respective shielded areas, and that said at least one end of the third shielding section has a width wider than other portions of the third shielding section.

The conductive shield has: a first shielding section that covers a top surface of the sealing layer; a second shielding section that covers the side surfaces of the sealing layer; and a third shielding section (shielding inner wall) that is disposed on the grooves and that electrically connects to the conductive pattern.

The third shielding section is formed along the conductive pattern. The starting end or the terminating end is connected to the second shielding section and has an auxiliary shielding section that is bent in the horizontal direction of the wiring substrate.

In another aspect, the present disclosure provides a method of manufacturing a circuit module, including: preparing a substrate having a plurality of electronic components mounted thereon, the substrate further having a conductive pattern that defines respective shielded areas where the electronic components are mounted, forming a sealing layer so as to cover the substrate and the electronic components; forming, along the conductive pattern, grooves in the sealing layer having a depth that reaches the conductive pattern by irradiating a surface of the sealing layer with a laser beam; and thereafter, applying a conductive resin on the sealing layer so as to form: a first shielding section made of the conductive resin, covering a top surface of the sealing layer; a second shielding section made of the conductive resin, covering side faces of the sealing layer; and a third shielding section made of the conductive resin, filling the grooves in the sealing layer, wherein in the step of forming the grooves, the grooves are shaped such that the third shielding section that fills the grooves has at least one end thereof connected to the second shielding section, the third shielding section thereby acting as shielding walls partitioning the respective shielded areas, and that said at least one end of the third shielding section has a width wider than other portions of the third shielding section.

It is to be understood that both the foregoing general description and the following detailed description are exemplary and explanatory, and are intended to provide further explanation of the invention as claimed.

BRIEF DESCRIPTION OF THE DRAWINGS

FIG. 5A is a plan view that shows the process for arranging the electronic components, and FIG. 5B is a cross-section of the important parts of FIG. 5A.

FIG. 6A is a plan view that shows the process for forming the sealing layer, and FIG. 6B is a cross-section of the important parts of FIG. 6A.

FIG. 7A is a plan view that shows the process for half-cutting, and FIG. 7B is a cross-section of the important parts of FIG. 7A.

FIG. 8A is a plan view that shows the process for forming the grooves, and FIG. 8B is a cross-section of the important parts of FIG. 8A.

FIG. 9A is a plan view that shows the process for forming the conductive shield, and FIG. 9B is a cross-section of the important parts of FIG. 9A.

FIG. 10A is a plan view that shows the individual division process, and FIG. 10B is a cross-section of the important parts of FIG. 10A.

FIG. 13A is a cross-section of FIG. 12 along the line B-B, and FIG. 13B is a cross-section along the line C-C.

DETAILED DESCRIPTION OF EMBODIMENTS

Figure 1:
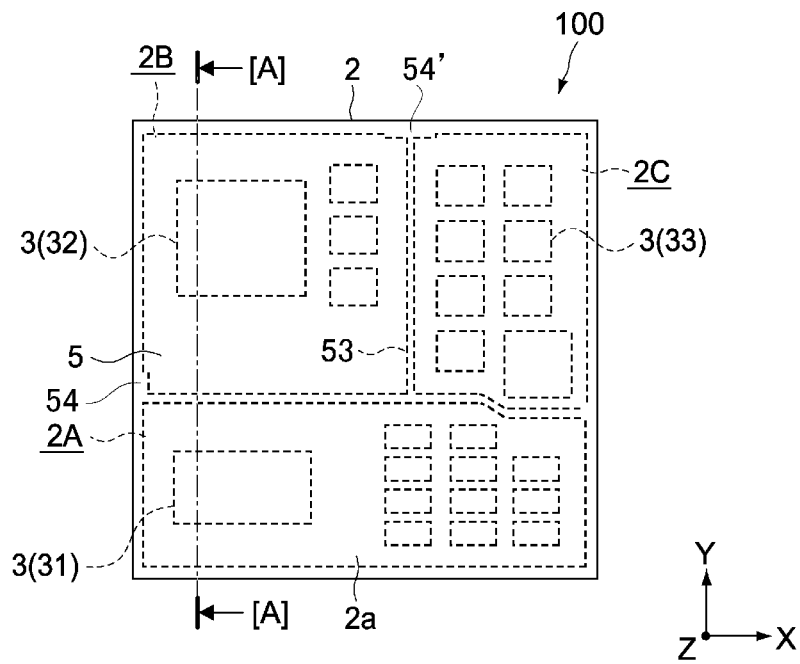
FIG. 1 is a plan view of a circuit module according to an embodiment of the present invention.

A circuit module according to an embodiment of the present invention is provided with: a wiring substrate; a plurality of electronic components; a sealing layer; and a conductive shield. The wiring substrate has: a mounting surface that includes a first region and a second region; and a conductive pattern, which is formed along the border of the first region and the second region on the mounting surface and which has the topmost layer thereof made of Au or Ag.

The plurality of electronic components are mounted in the first region and the second region.

The sealing layer covers the plurality of electronic components and is formed of an insulating material. The sealing layer has grooves that are formed along the above-mentioned border and that have a depth such that at least a portion of the grooves reaches the topmost layer of the conductive pattern.

The conductive shield has: a first shielding section that covers the top surface of the sealing layer; a second shielding section that covers the side faces of the sealing layer; and a third shielding section that is disposed in the grooves and that electrically connects to the conductive pattern.

The third shielding section has an auxiliary shielding section, of which the starting end or the terminating end is connected to the second shielding section and which is curved in the horizontal direction of the wiring substrate.

The topmost layer of the conductive pattern is made of Au (gold) or Ag (silver); thus, compared to other metals such as Cu, the conductive pattern has high reflectance properties against laser beams such as from a Nd:YAG laser (wavelength of 1064 nm), for example. Therefore, when grooves are formed in a resin layer by using the laser beam, the conductive pattern can be effectively protected from burns or cuts that result from the radiation of the laser beam. This ensures the electrical connection between the conductive pattern and the third shielding section disposed in the grooves, and since the grooves can be formed in any shape, this also enhances the degree of freedom in designing the shape of the shield.

The wiring substrate may further have a terminal surface that is disposed opposite to the mounting surface and that electrically connects to the conductive pattern.

In this way, since the conductive pattern can be connected to ground potential via a control substrate of an electronic device, the shielding properties of the third shielding section can be improved.

The wiring substrate may have an insulating protective layer that covers the mounting surface and that has an opening that exposes at least a portion of the topmost layer of the conductive pattern.

This can facilitate the forming of an Au or Ag layer on the surface of the conductive pattern. Moreover, adhesion of the sealing layer to the mounting surface can be improved via the protective layer.

The conductive pattern may be formed of a single layer structure made from Au or Ag, or may be formed of a multilayer structure in which two or more types of metal are stacked. Typically, the conductive pattern includes: a first metal layer formed of Cu (copper), and a second metal layer that is formed on the surface of the first metal layer and that is made of Au or Ag. In this way, the wiring substrate can be formed at a relatively low cost, and the Au or Ag layer can be selectively formed in the required regions.

A third metal layer of the conductive pattern formed of a metal material that has a higher melting point than Cu may be disposed between the first metal layer and the second metal layer.

This increases the heat-resistance of the conductive pattern and makes it possible for the third metal layer to protect the first metal layer even if the second metal layer is burned by the radiation of the laser beam.

The third shielding section may be a hardened conductive resin that fills the grooves, or may be a plating or sputtering film deposited on the inner wall of the grooves.

The auxiliary shielding section is integrally formed as a portion of the starting end or terminating end of the third shielding section. As shown in FIGS. 11A to 11H, the auxiliary shielding section is bent and formed in the shape of an "L" or a "T," for example, so as to contact the location where the second shielding section is expected to be formed. In this way, since the starting end or terminating end of the third shielding section can be caused to reach reliably the conductive pattern, shielding reliability against electromagnetic waves and the like is improved. Additionally, by providing this kind of auxiliary shielding section, warping and deformation of the substrate can be suppressed.

The way in which the inventors arrived at the idea of providing the above-mentioned auxiliary shielding section will be explained in part by referencing the related art.

Figure 12:
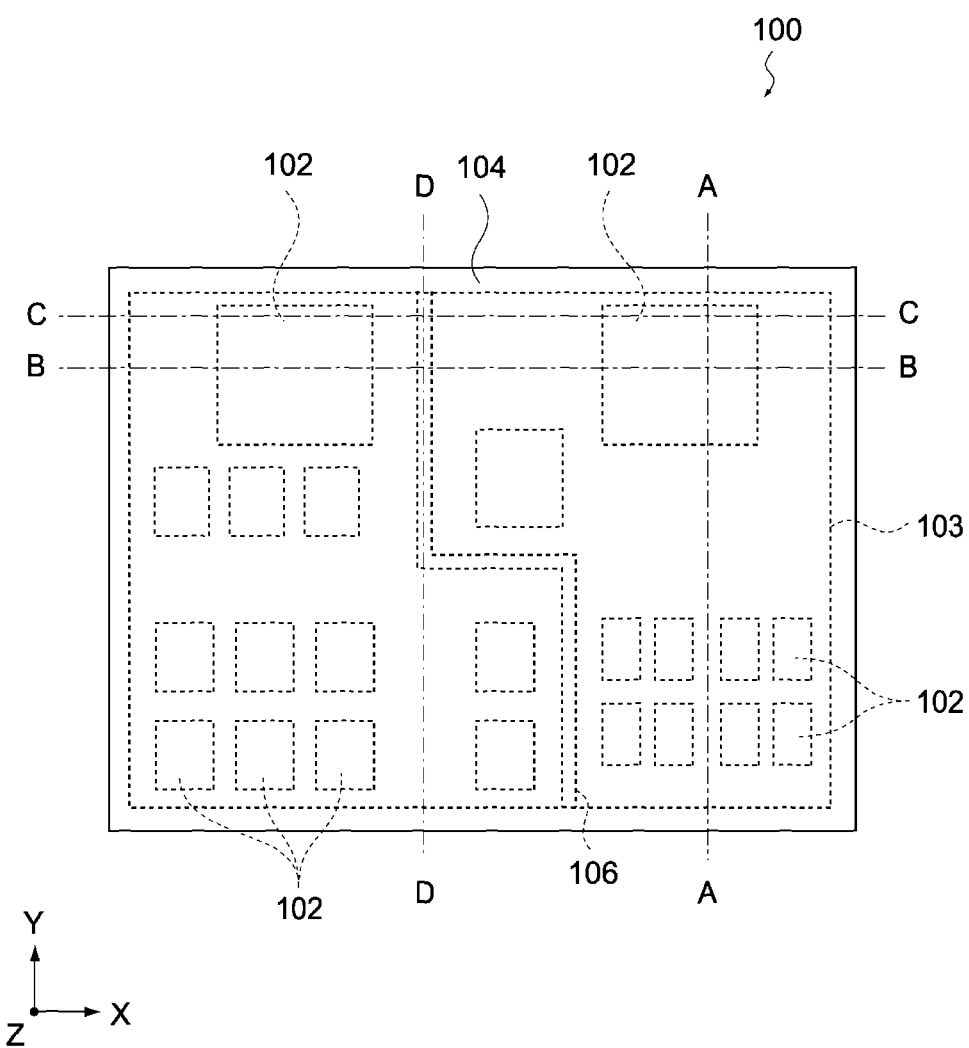
FIG. 12 is a plan view of a circuit module according to the related art.
Figure 13A:
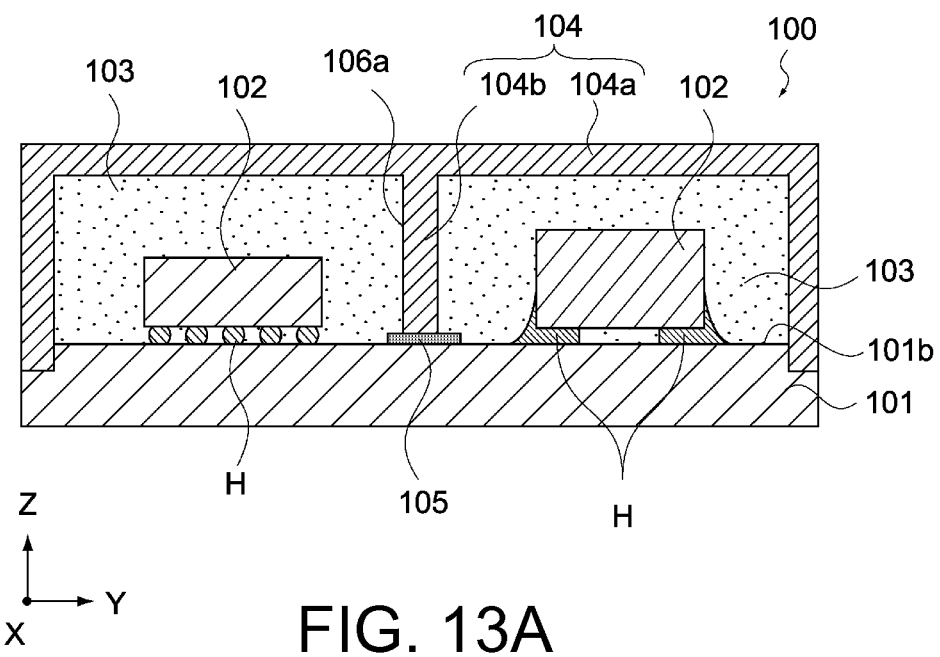
FIGS. 13A and 13B are cross-sections of the circuit module according to the related art.
Figure 13B:
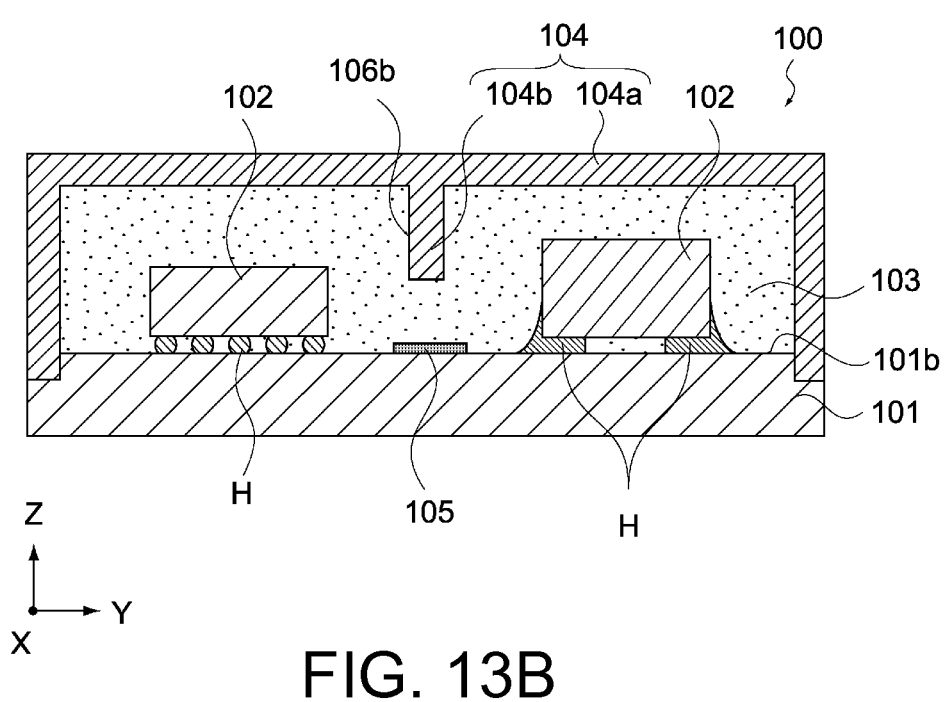
Figure 14:
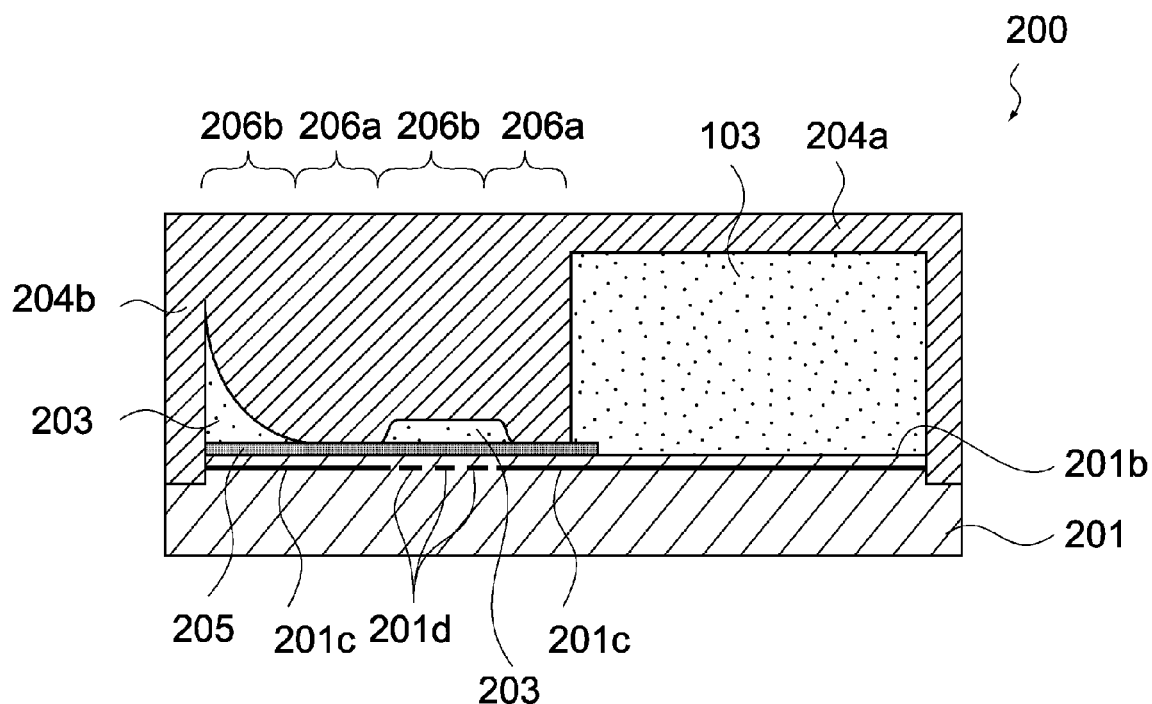
FIG. 14 is a cross-section of the circuit module according to the related art along the line D-D.
Figure 14:
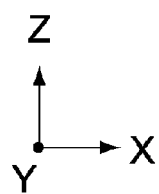

FIGS. 12 to 14 show circuit modules according to the related art. There were cases in which, like reference character 104*b* in FIG. 13B, a third shield wall that divides the interior of the mold did not reach the conductive pattern 105.

As a countermeasure, an object of the present invention is to cause reliably the shield walls to reach the conductive pattern at both the starting end and the terminating end of the third shielding section.

FIGS. 11A to 11H schematically illustrate the shape of the auxiliary shielding section. Reference character 41*c* refers to a contour line that represents a contour of the grooves that contact the top surface of the sealing layer. Reference character 41*d* refers to a contour line that represents a contour of the grooves that contact the conductive pattern.

Reference character 14 is a scrub area, which is a location that, after grooves are formed via a dicer, is filled with a conductive resin, and is ultimately the location that will become the second shielding section.

Usually, the laser beam used to form the grooves has a uniform beam diameter, and when scanning (either by continuous radiation or pulses of radiation) is performed with only a fixed amount of energy, the grooves formed by the laser have a uniform width, and the starting end and the terminating end of the formed grooves are shallower than the center portion of the grooves.

It was found that, when the grooves were viewed in cross-section in specific directions, the starting end and the terminating end of the grooves were less inclined when viewed in cross-section in the scanning direction of the laser compared to being viewed in cross-section in a direction orthogonal to the scanning direction.

Thus, in order to cause the starting end and the terminating end of the third shielding section to reliably reach the conductive pattern, consideration was given to increasing the number of pulses of the pulse laser at the starting end and terminating end, for example.

The inventors carried out tests regarding this idea, and it was learned that when the number of pulses of laser radiation were increased for the same location, a problem occurred in which the grooves became wider in only that specific location.

Additionally, the results of the experiments showed that even if the starting end and the terminating end of the third shielding section are repeatedly irradiated by the laser, the groove formation at the starting end and the terminating end will not cleanly produce a conductive pattern.

It is believed that the reason for this is that the amount of laser energy radiated at the edge of the effective diameter of the laser is lower than that at the center of the laser, which prevents the formation of a clean conductive pattern.

Thus, in order to properly form the ends, consideration has been given to moving the center of the laser to the ends of shielding section, which are the main target. When this is done, however, another problem arises in that the grooves are formed so as to extend beyond the desired location (see FIG. 11D).

This is especially a problem when, as in the present embodiment, a method of manufacturing is used in which the aggregate substrate is individually divided after the grooves are formed. This is due to that when groove formation is caused also to occur on the adjacent module so that the grooves are properly formed, the wiring and mounted components on the adjacent module are damaged.

A method of manufacturing a circuit module according to an aspect of the present invention includes: preparing a wiring substrate on a mounting surface that includes a first region and a second region, the wiring substrate having formed thereon a conductive pattern along the border of the first region and the second region of the mounting surface and electrically connected to a terminal surface that is opposite to the mounting surface.

A layer of Au or Ag is formed on the surface of the conductive pattern.

A plurality of electronic components are mounted on the first region and the second region.

A sealing layer, which is made of an insulating material that covers the plurality of electronic components on the mounting surface, is formed.

By irradiating the surface of the sealing layer with a laser beam, the grooves are formed along the border at a depth such that at least a portion of the topmost layer of the conductive pattern is exposed to the sealing layer.

By filling the grooves with a conductive resin and covering the outer surface of the sealing layer with the conductive resin, the conductive shield is formed.

For the step of forming a layer of Au or Ag, an insulating protective layer, which has an opening that exposes at least a portion of the topmost layer of the conductive pattern, may be formed, and the layer of Au or Ag may be formed with the protective layer functioning as a mask.

This facilitates the formation of an Au or Ag layer on the surface of the conductive pattern. Moreover, the protective layer can enhance the adhesion between the sealing layer and the mounting surface.

The grooves can be formed by irradiating the surface of the sealing layer with a Nd-YAG laser beam, for example. By so doing, it becomes possible to form the grooves in any shape while properly protecting the conductive pattern, and furthermore, it also becomes possible, by using a laser beam with a relatively long wavelength, to both decrease the amount of laser light that the respective metals layer absorb and decrease the extent to which the respective metal layers are damaged by the radiation from the laser beam.

According to the above-mentioned method of manufacturing a circuit module, since a laser is used to formed the grooves, the grooves can be more easily formed in a desired shape as compared to if the grooves were formed by dicing, for example. This improves the degree of design freedom for the shape of the shield. In addition, since a layer of Au or Ag is provided on the topmost layer of the region where the grooves are formed, the wiring substrate and the conductive pattern formed on the surface of the wiring substrate can be protected from the radiation of the laser beam.

Figure 2:
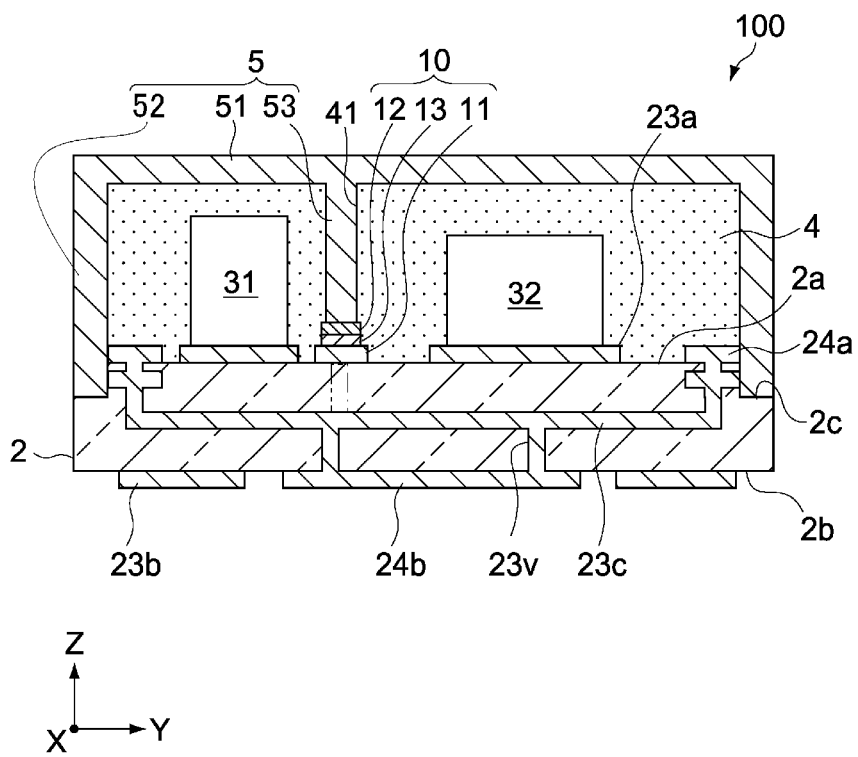
FIG. 2 is a cross-sectional view in the direction of the line [A]-[A] in FIG. 1.
Figure 3:
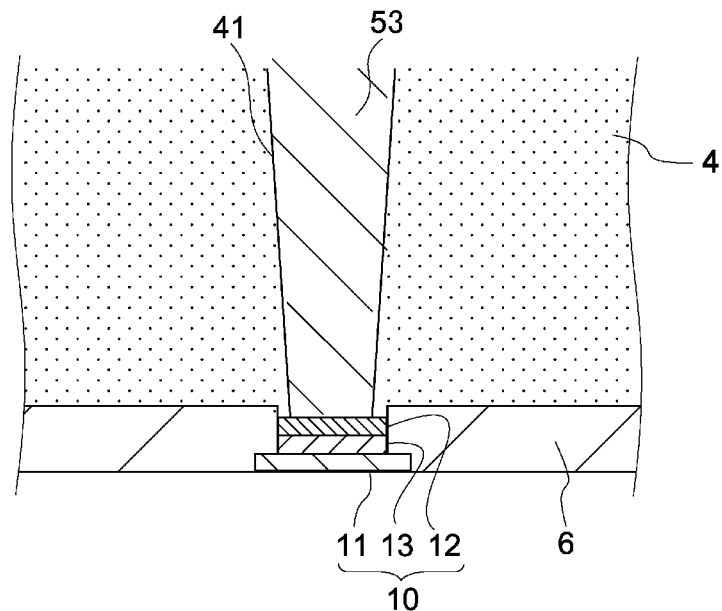
FIG. 3 is a magnified cross-sectional view of important parts of the circuit module.

Embodiments of the present invention will be described below with reference to the drawings. FIGS. 1 to 3 illustrate a circuit module according to an embodiment of the present invention. FIG. 1 is a top view, FIG. 2 is a cross-section in the direction of the line [A]-[A], and FIG. 3 is a magnified cross-section of FIG. 2.

In the respective figures, the X, Y, and Z axes respectively represent three mutually orthogonal axes, with the Z-axis direction corresponding to the thickness direction of the circuit module. In order to make the drawings easier to understand, the various configurations are shown in an exaggerated view. The size of the members and the size ratios among the various members shown in the drawings may not correspond to the actual values.

(Configuration of Circuit Module)

A circuit module 100 according to the present embodiment has: a wiring substrate 2; a plurality of electronic components 3 (31 to 33); a sealing layer 4; and a conductive shield 5.

The circuit module 100 is configured to have a substantially cuboid shape as a whole. There are no specific limits to the size of the module, and the module is configured such that the lengths along the X-axis and Y-axis directions are 10 mm to 50 mm respectively, for example. In the present embodiment, the module is configured to have a substantially square shape in which one side in the present embodiment has a length of approximately 35 mm. In addition, there are no specific limits to the thickness of the module, and the module may be configured to have a thickness of 1 mm to 3 mm for example. In the present embodiment, the module is configured to have a thickness of approximately 2 mm.

In the circuit module 100, a plurality of electronic components 3 are disposed on the wiring substrate 2, and the sealing layer 4 and the conductive shield 5 are formed so as to cover the components. The respective components of the circuit module 100 will be explained below.

(Wiring Substrate)

The wiring substrate 2 has a mounting surface 2a that is configured to have a substantially rectangular shape with dimensions identical to the overall dimensions of the circuit module 100, and a terminal surface 2b on the side opposite of the mounting surface 2a, for example. The wiring substrate is configured to be a glass epoxy multilayer wiring substrate with a thickness of approximately 0.4 mm, for example. The material that forms an insulating layer of the wiring substrate 2 is not limited to the above-mentioned glass-epoxy material, and an insulating ceramic material or the like can be used, for example.

The wiring layers of the wiring substrate 2 are typically made of a conductive material such as Cu and respectively disposed on the front surface, rear surface, and inner layer of the wiring substrate 2. The wiring layers are each patterned to be a prescribed shape, thereby respectively forming the top layer wiring pattern 23a on the mounting surface 2a, bottom wiring pattern 23b on the terminal surface 2b, and the inner layer wiring pattern 23c therebetween. The top wiring pattern 23a includes lands where electronic components 3 are mounted, and a conductive pattern 10 that connects to a third shielding section 53 (conductive shield 5). The bottom layer wiring pattern 23b includes an external connection terminal that connects to a control substrate (not shown) of an electronic device on which the circuit module 100 is mounted. The respective wiring layers are electrically connected to one another through a via conductor 23v.

The wiring layers also include a first GND terminal 24a and a second GND terminal 24b that connect to ground (GND) potential. The first GND terminal 24a is disposed adjacent to a stepped area 2c formed in the top periphery of the wiring substrate 2 and connects to the inner surface of the second shielding section 52 (conductive shield 5), which is provided on the stepped area 2c. The first GND terminal 24a may be formed as part of the top layer wiring pattern 23a or maybe formed as part of the inner layer wiring pattern 23c.

The second GND terminal 24b connects to the first GND terminal 24a via the inner layer wiring pattern 23c. The second GND terminal 24b is formed as a part of the bottom layer wiring pattern 23b and connects to the ground wiring of the control substrate.

The mounting surface 2a is demarcated into a plurality of regions by the third shielding section 53 (conductive shield 5), and in the present embodiment, has a first region 2A, second region 2B, and third region 2C. In the example in the drawings, the first to third regions 2A to 2C are rectangular shapes with differing sizes and shapes, but in practice may be any geometric shape, such as a triangle, pentagon, other more complex polygonal shapes, or circular or elliptical shapes. The number of regions demarcated on the mounting surface 2a is not limited to the three described above, and there may be two, four, or more regions.

The conductive pattern 10 has a first metal layer 11 as a bottom layer, a second metal layer 12 as a top layer, and a third metal layer therebetween, and is formed around the border of the respective regions on the mounting surface 2a. The conductive pattern 10 electrically connects to the second shielding section 52.

The first metal layer 11 forms a part of the top layer wiring pattern 23a and is typically made of Cu. The thickness of the first metal layer 11 has no particular limitations, and is 10 μm to 15 μm, for example. The first metal layer 11 connects to the second GND terminal 24b on the terminal surface 2b through the via conductor 23v and inner layer wiring pattern 23c.

The second metal layer 12 is made of Au or Ag, and is Au in the present embodiment. The thickness of the second metal layer 12 has no particular limitations, and is formed at a thickness that can protect the first metal layer 11 from the laser used to process the grooves 41 (described later), such as 1 μm to 10 μm, for example.

The third metal layer 13 is made of a metal material with a higher melting point than the first metal layer 11. If the first metal layer 11 is Cu, for example, then the third metal layer may be Ni (nickel), Ti (titanium), Cr (chromium), or the like. The thickness of the third metal layer 13 has no particular limitations, and is 1 μm to 10 μm, for example. The third metal layer 13 functions to enhance thermal resistance of the conductive pattern 10 and to protect the first metal layer 11 from laser radiation if the laser used for processing burns the second metal layer 12. It should be noted that the third metal layer 13 may be omitted as necessary.

The second metal layer 12 and third metal layer 13 may be constituted by a plating film or a sputtering film formed with a mask that is an insulating protective layer 6 (see FIG. 3) having an aperture exposing at least a portion of the first metal layer 11.

(Electronic Components)

The plurality of electronic components 3 are respectively mounted on the first, second, and third regions 2A to 2C on the mounting surface 2a. The plurality of electronic components 3 typically include various types of units such as integrated circuits (ICs), capacitors, inductors, resistors, crystal vibrators, duplexers, filters, power amps, or the like.

These components include those that generate electromagnetic waves around themselves during operation, those that are susceptible to these electromagnetic waves, and the like. These types of components are mounted on differing regions from one another as partitioned by the third shielding section 53 (conductive shield 5). Hereinafter, the single or plurality of electronic component(s) 3 mounted on the first region 2A will also be referred to as "electronic components 31," and the single or plurality of electronic component(s) 3 mounted on the second region 2B will be referred to as "electronic components 32." The single or plurality of electronic component(s) 3 mounted on the third region 2C will be referred to as "electronic components 33."

The plurality of electronic components 3 are typically mounted on the mounting surface 2a by solder, an adhesive agent, an anisotropic adhesive sheet, bonding wires, or the like.

(Sealing Layer)

The sealing layer 4 is made of an insulating material formed on the mounting surface 2a so as to cover the plurality of electronic components 31 and 32. The sealing layer 4 is divided by the third shielding section 53 into the first region 2A side, second region 2B side, and third region 2C side. In the present embodiment, the sealing layer 4 is made of an insulating resin such as an epoxy resin with silica or alumina added thereto, for example. The forming method of the sealing layer 4 has no particular limitations, and is formed by a molding method, for example.

The sealing layer 4 has grooves 41 formed along the borders of the first region 2A, second region 2B, and third region 2C. The grooves 41 are formed at a prescribed depth along the Z axis direction from the top of the sealing layer 4. In the present embodiment, the bottoms of the grooves 41 are typically formed at a depth that reaches the second metal layer 12 of the conductive pattern 10 disposed on the mounting surface 2a, but the grooves may be formed at a depth such that at least a portion of the bottoms thereof reach the second metal layer 12.

The forming method of the grooves 41 has no particular limitations, and the groves 41 are formed by laser processing technology in the present embodiment. The laser used for processing has no particular limitations, but in the present embodiment a Nd:YAG laser (1064 nm wavelength) is used.

(Conductive Shield)

The conductive shield 5 has the first shielding section 51, second shielding section 52, and third shielding section 53. The starting end and terminating end of the third shielding section has an auxiliary shielding section that contacts the second shielding section and curves in the horizontal direction of the wiring substrate. In this example, "the starting end and terminating end of the third shielding section contacts the second shielding section" includes aspects in which a part of the starting end or terminating end enters inside the second shielding section. The first shielding section 51 and second shielding section 52 are formed to cover the outer front surfaces of the sealing layer 4 (i.e., surfaces including the top surface and side faces of the sealing layer 4; used with this connotation hereinafter) and function as outer shields of the circuit module 100. The third shielding section 53 is provided in the grooves 41 in the sealing layer 4 and functions as an inner shield of the circuit module 100.

The conductive shield 5 is made of a hardened material from a conductive resin material filled into the outer surfaces of the sealing layer 4 and inside the grooves 41; more specifically, the conductive shield is an epoxy resin with conductive particles such as Ag or Cu added thereto, for example. Alternatively, the conductive shield 5 may be a plating film or a sputtering film deposited on the outer surfaces of the sealing member 4 and inner walls of the grooves 41.

This type of configuration makes it possible to form the first shielding section 51, second shielding section 52, and third shielding section 53 in the same step. Furthermore, it is possible to form the first shielding section 51, second shielding section 52, and third shielding section 53 in integration with one another. The auxiliary shielding section 54 is curved into an "L" shape so as to extend a portion of the third shielding section to contact a location where the second shielding section will be formed and so as to be formed along the third shielding section. This makes it possible to shield reliably the starting end and terminating end of the third shielding section from electromagnetic waves and allows for suppression of warping and deformation of the starting end and terminating end sections.

Figure 11A:
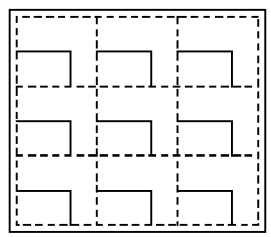
FIGS. 11A to 11H show in detail the auxiliary shielding section of an embodiment of the present invention.
Figure 11B:
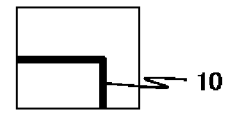
Figure 11C:
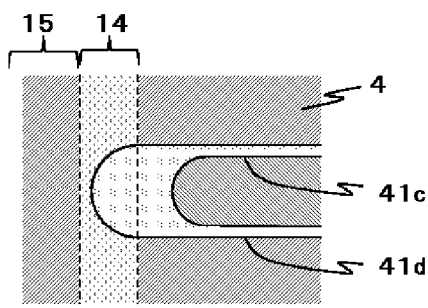
Figure 11D:
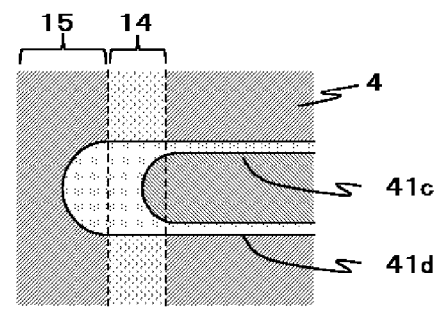
Figure 11E:
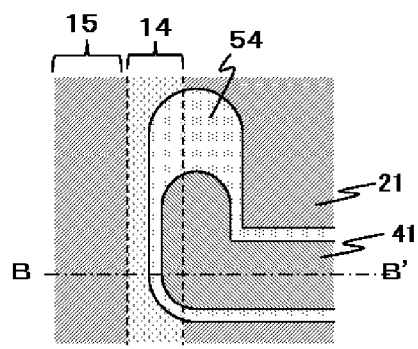
Figure 11F:
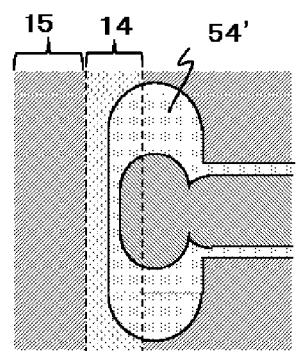
Figure 11G:
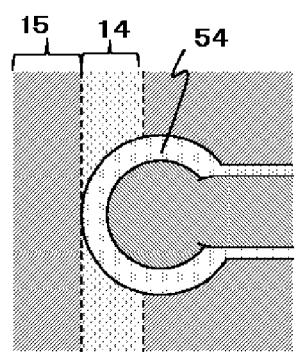
Figure 11H:
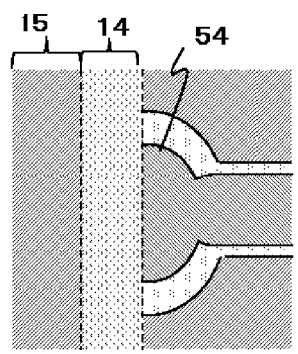

Furthermore, as shown by an auxiliary shielding section 54' in FIG. 1, the auxiliary shielding section may be curved into a "T" shape. It should be noted that the shape of the auxiliary shielding section is not limited to an "L" shape or "T" shape and may be formed such that the starting end or terminating end for the third shielding section is an elliptical or semicircle shape, as shown in FIGS. 11G and 11H, for example.

(Method of Manufacturing Circuit Module)

Next, a method of manufacturing the circuit module 100 of the present embodiment will be described.

FIGS. 4 to 10B are views for explaining a method of manufacturing the circuit module 100. FIGS. 5A to 10B are (A) top views and (B) cross-sectional views of primary components seen from the X axis direction. The method of manufacturing the circuit module according to the present embodiment includes: preparing an aggregate substrate;

mounting an electronic component; forming a sealing layer; half-cutting; forming a groove; forming a conductive shield; and cutting. Each of these steps will be described below.

(Preparing Aggregate Substrate)

Figure 4:
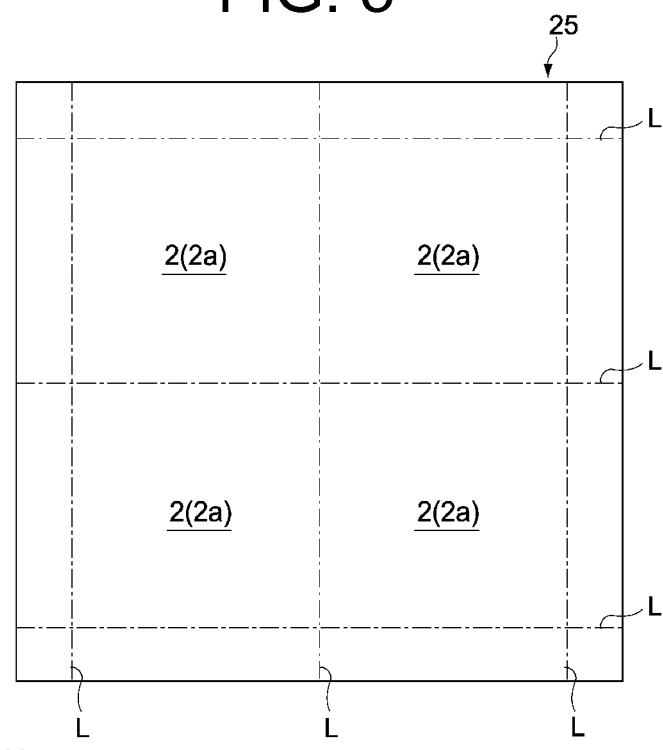
FIG. 4 illustrates a method of manufacturing the circuit module.

FIG. 4 is a top view that schematically shows a configuration of an aggregate substrate 25. The aggregate substrate 25 is made of a large-area substrate having a plurality of wiring substrates 2 printed thereon. FIG. 4 shows dividing lines L that demarcate the respective plurality of wiring substrates 2. These dividing lines may be virtual or may actually be drawn on the aggregate substrate 25 via printing or the like.

It should be noted that the example in the drawing shows four wiring substrates 2 to be cut from the single aggregate substrate 25, but the number of wiring substrates 2 to be cut has no particular limitations. If a substantially square-shaped substrate being approximately 150 mm on each side is used as the aggregate substrate 25, for example, then four of the wiring substrates 2 with approximately 35 mm on each side can be arrayed in both the X axis direction and Y axis direction for a total of sixteen substrates. A rectangular substrate with each side being approximately 100 mm to 200 mm is typically used as the aggregate substrate 25.

The conductive shield 5 is formed through the respective steps (described later) on the aggregate substrate 25, and the substrate is cut (full-cut) along the dividing lines L in the final cutting step, thereby fabricating a plurality of the circuit modules 100 from the single aggregate substrate 25. Furthermore, although not shown, prescribed wiring patterns are formed in the aggregate substrate 25 in the respective regions constituting the wiring substrates 2.

Conductive patterns 10 made of the first metal layer 11, second metal layer 12, and third metal layer 13 are formed on the borders of the respective regions on the wiring substrates 2. The forming method of the second metal layer 12 and third metal layer 13 of the conductive patterns 10 has no particular limitations, and may be a vacuum deposition method such as plating or sputtering.

In the present embodiment, the second metal layer 12 and third metal layer 13 of the conductive patterns 10 are formed using an insulating protective layer 6 as a mask, as shown in FIG. 3. First, resist is coated onto the mounting surface 2a of each wiring substrate 2 to cover the first metal layer 11 (top layer wiring pattern 23a), and the resist is patterned into a prescribed shape to form the protective layer 6. Next, the third metal layer 13 and second metal layer 12 are formed in the stated order by an electrolytic plating method or the like on the surface of the first metal layer 11 with the protective layer 6 as the mask.

(Mounting Electronic Components)

Figure 5A:
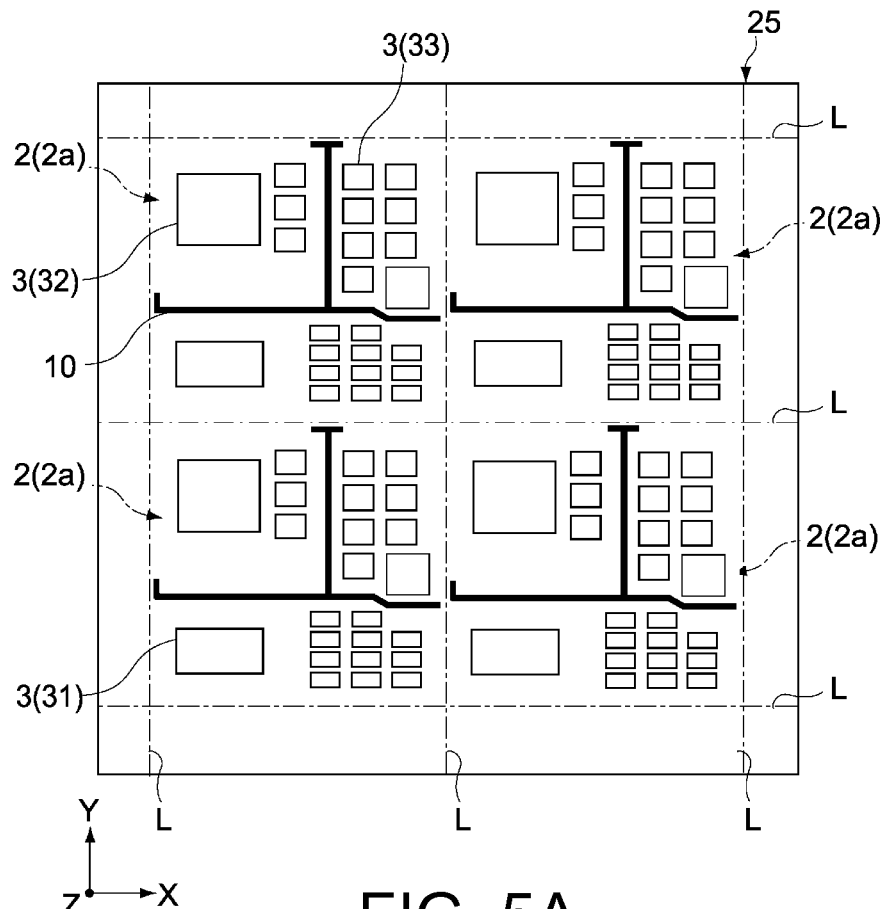
FIGS. 5A and 5B are views that illustrate the method for manufacturing the circuit module.
Figure 5B:
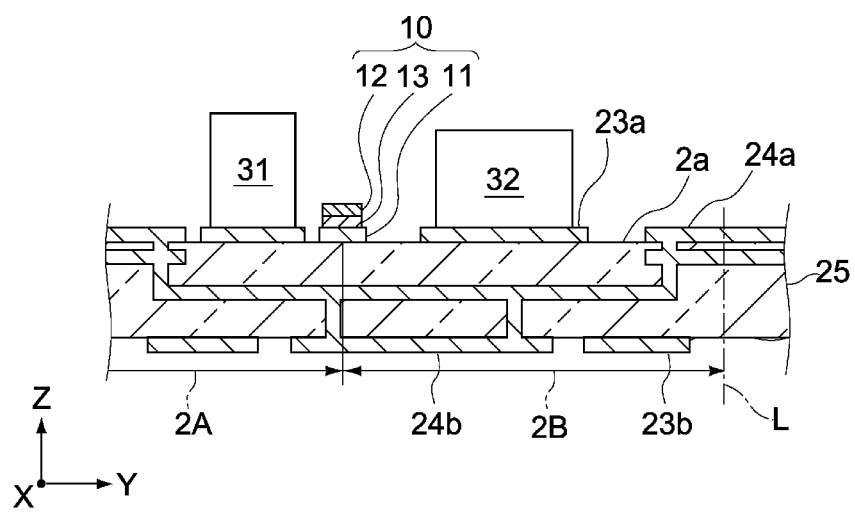

FIGS. 5A and 5B are views for explaining the mounting of electronic components 3 (31 to 33) and show an aspect in which the electronic components 31 to 33 are arranged on the aggregate substrate 25 (wiring substrates 2).

In the mounting step, the plurality of electronic components 31 to 33 are respectively mounted on the first region 2A, second region 2B, and third region 2C of each mounting surface 2a. A reflow system is used as the mounting method for the electronic components, for example. Specifically, first, solder paste is coated by screen printing or the like onto prescribed lands on the mounting surface 2a, and then the plurality of electronic components 31 to 33 are respectively mounted on the prescribed lands through the solder paste. Thereafter, the aggregate substrate 25 on which the electronic components 31 to 33 are mounted is loaded into the reflow oven and the respective electronic components 31 to 33 are then electrically and mechanically bonded to the mounting surfaces 2a via reflow soldering.

(Forming Sealing Layer)

Figure 6A:
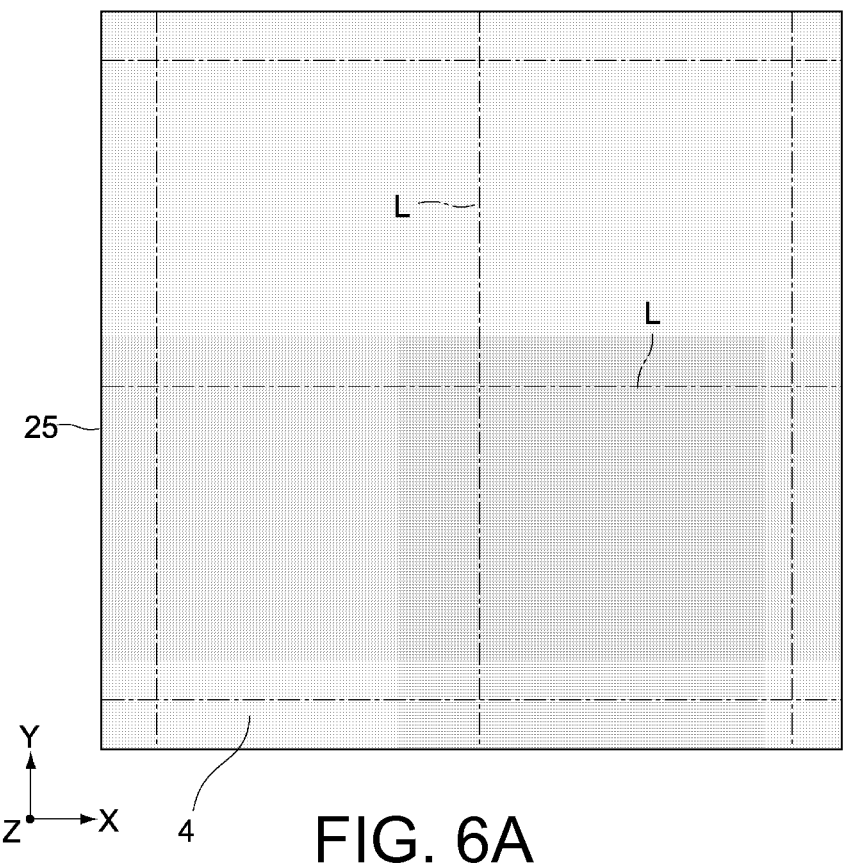
FIGS. 6A and 6B are views that illustrate the method for manufacturing the circuit module.
Figure 6B:
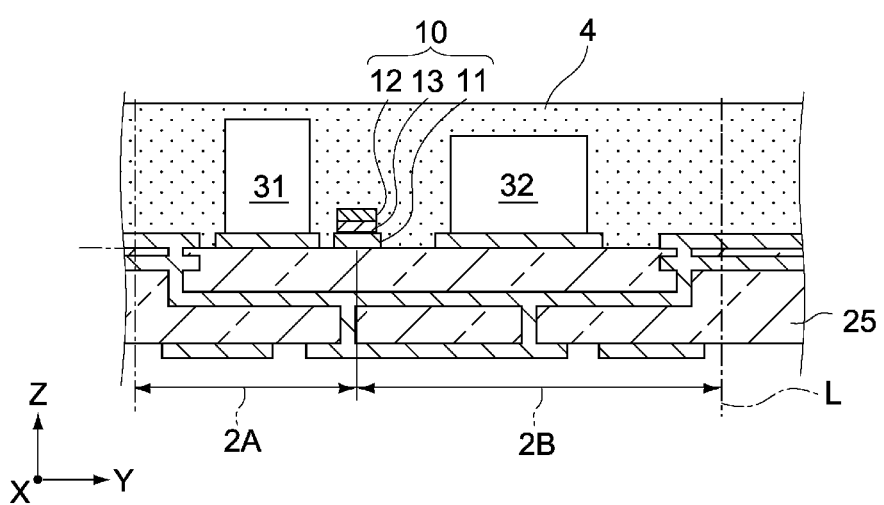

FIGS. 6A and 6B are views for explaining the forming of the sealing layer 4 and show an aspect in which the sealing layer 4 is formed on the mounting surface 2a.

The sealing layer 4 is formed on the mounting surface 2a of the aggregate substrate 25 so as to cover the plurality of electronic components 31 to 33. The forming method of the sealing layer 4 has no particular limitations, and it is possible to use a molding method, a potting method that does not use a mold, or the like, for example. Furthermore, a liquid or paste-like sealing resin material may be coated onto the mounting surface 2a via spin coating/screen printing and then cured via a thermal treatment, for example.

(Half-Cutting)

Figure 7A:
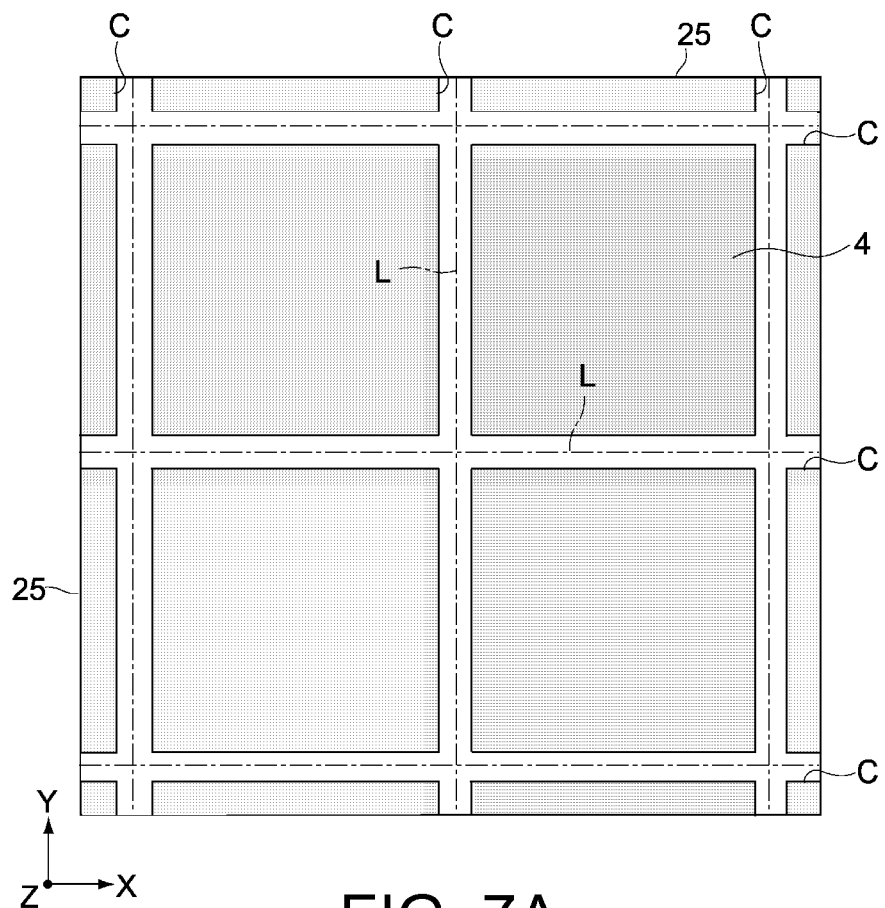
FIGS. 7A and 7B are views that illustrate the method for manufacturing the circuit module.
Figure 7B:
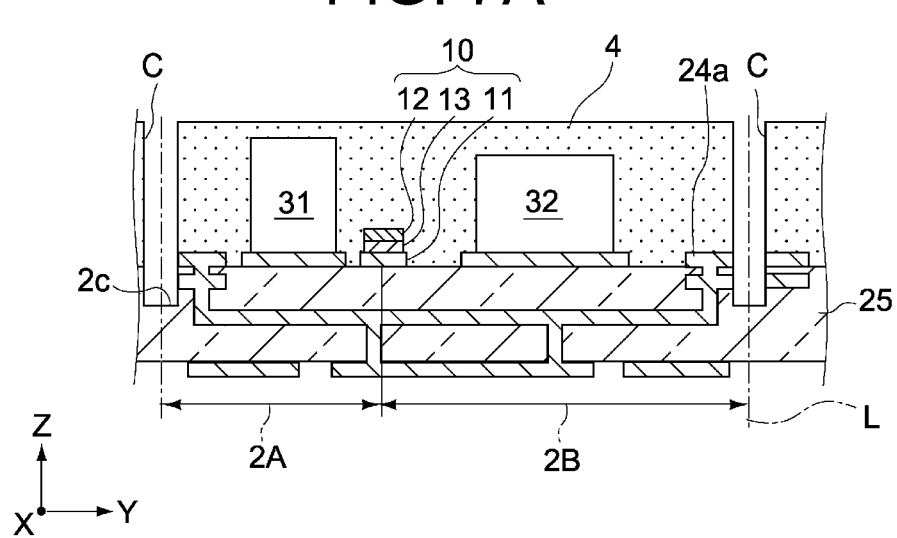

FIGS. 7A and 7B are views for explaining the half-cutting step. In the half-cutting step, a dicer forms cutting grooves C along the dividing lines L at a depth reaching from the top of the sealing layer 4 to the inside of the aggregate substrate 25. The cutting grooves C form stepped areas 2c in the aggregate substrate 25 (wiring substrates 2). The depth of the cutting grooves C has no particular limitations, but is a depth that can disconnect the GND terminals 24a on the aggregate substrate 25.

(Forming Grooves)

Figure 8A:
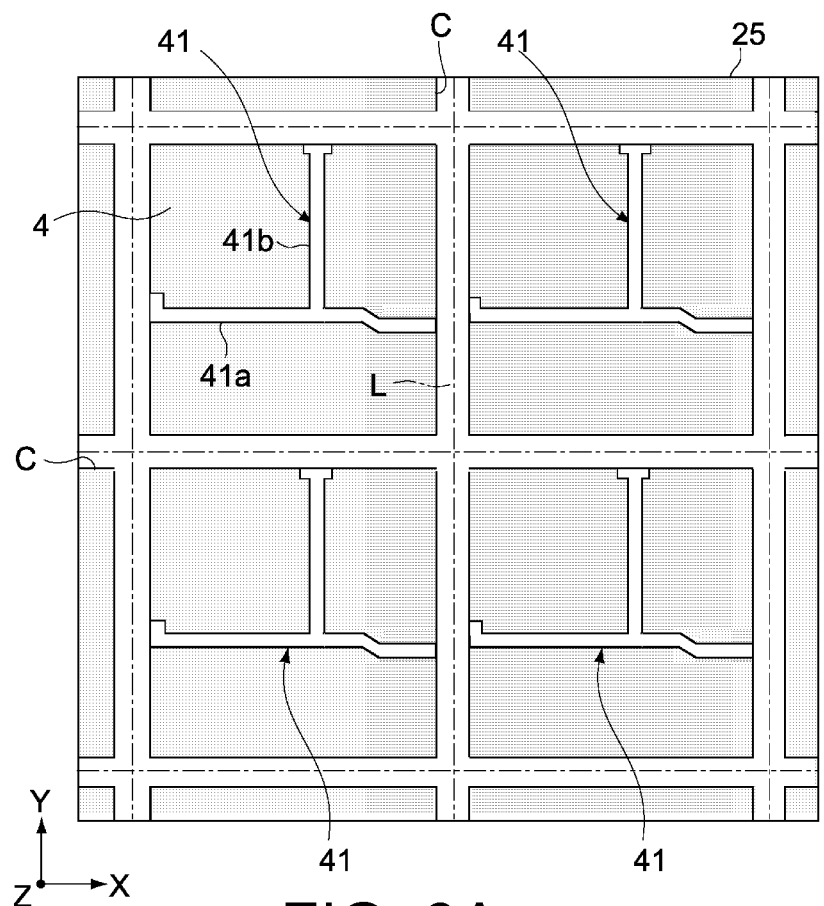
FIGS. 8A and 8B are views that illustrate the method for manufacturing the circuit module.
Figure 8B:
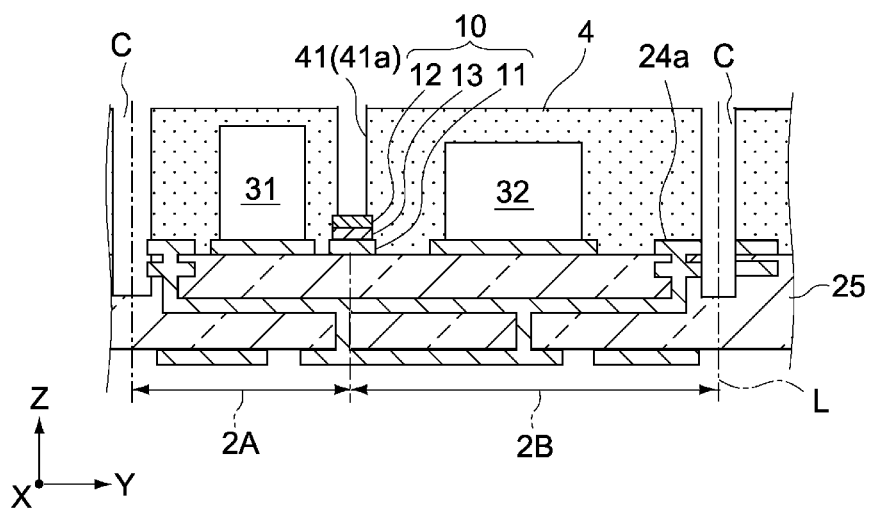

FIGS. 8A and 8B are views for explaining forming of the grooves 41. The grooves 41 are formed along the borders among the regions 2A to 2C on each mounting surface 2a. In other words, the grooves 41 have a first groove section 41a formed along the border of the first region 2A with the second and third regions 2B & 2C, and a second groove section 41b formed along the border of the second region 2B and third region 2C.

An Nd-YAG laser is used to form the grooves 41. The laser beam may be continuous waves or pulsed waves. The laser beam is incident on the installation area of the third shielding section 53 from the top surface side of the sealing layer 4. The resin material in the incident area of the laser beam is partially removed by melting or evaporation. The laser scans the top of the sealing layer 4 at a uniform power and speed to form the grooves 41 at an approximately uniform depth, for example. The number of scans is not limited to one, and a plurality of scans may be repeated.

The width of the grooves 41 has no particular limitations, but a smaller width progressively decreases the ability to fill in the conductive resin for forming the third shielding section 53, and a greater width progressively narrows the mounting area of the electronic components 3 and lowers the ability to adapt to smaller modules. In the present embodiment, the width of the grooves 41 is set at a size of 0.05 mm to 0.3 mm.

The depth of the grooves 41 is typically formed such that the bottom of the grooves 41 reaches the vicinity of the mounting surface 2a. In the present embodiment, the grooves 41 are formed at a depth that reaches the second metal layer 12 of the conductive pattern 10. This makes it so the grooves 41 having a depth that exposes the second metal layer 12 of the conductive pattern 10 to the sealing layer 4 are formed along the borders of the respective areas 2A to 2C. At such time, the second metal layer 12 formed of Au or Ag, which have relatively high reflectance and low absorption of the laser, reflects the laser that has reached the bottom of the grooves 41. This effectively protects the first metal layer 11 disposed below the second metal layer 12.

The forming procedure of the grooves 41 has no particular limitations, and the second groove section 41b may be formed after the first groove section 41*a*, or the first groove section 41*a* may be formed after the second groove section 41*b*. Furthermore, the grooves 41 may be formed before the half-cutting step.

The grooves used for forming the auxiliary shielding section 54 and auxiliary shielding section 54' are formed at the time of processing of the grooves 41.

(Forming Conductive Shield)

Figure 9A:
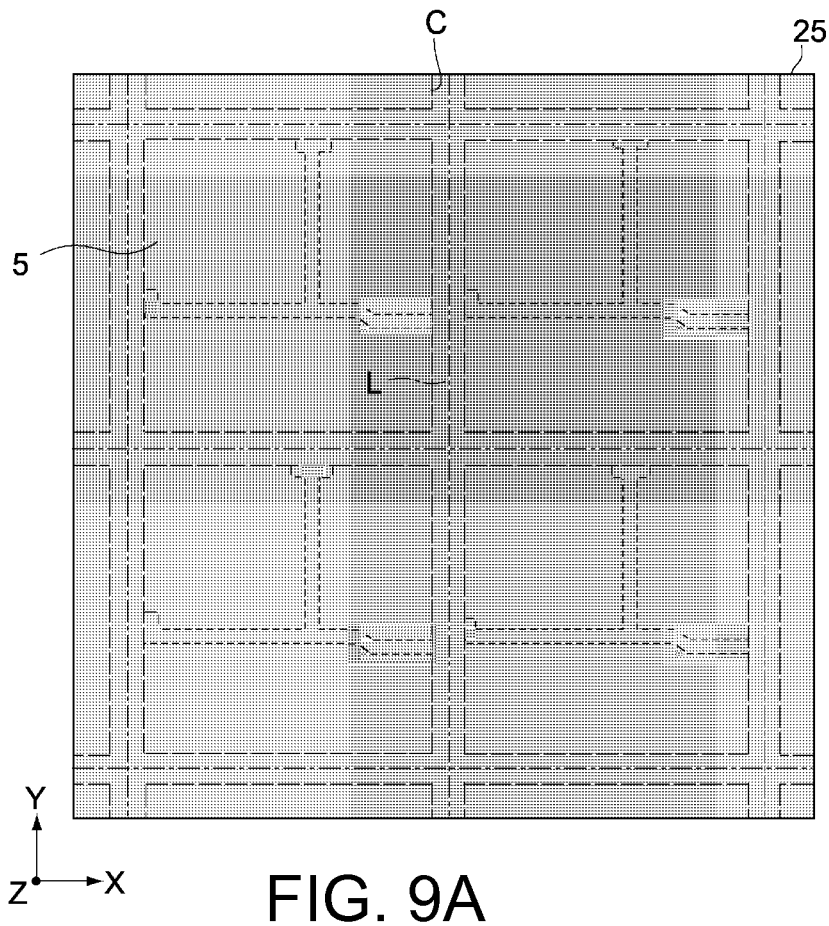
FIGS. 9A and 9B are views that illustrate the method for manufacturing the circuit module.
Figure 9B:
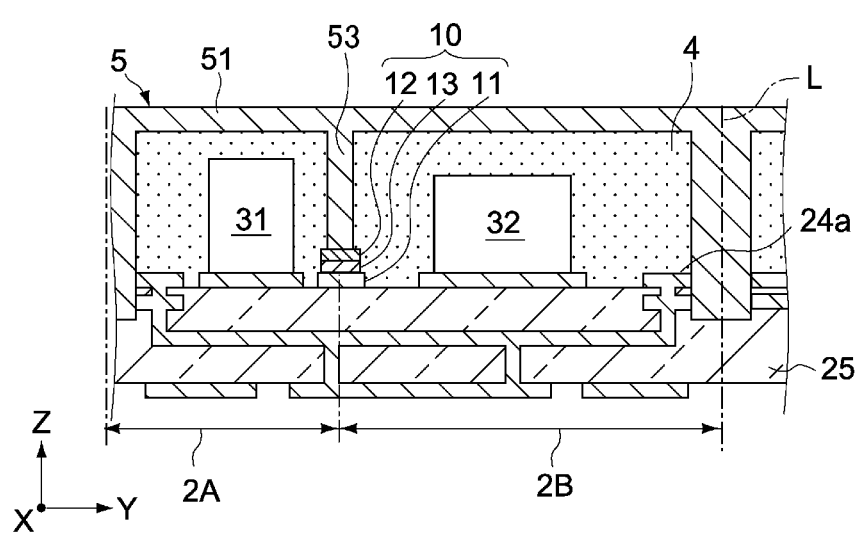

FIGS. 9A and 9B are views for explaining forming of the conductive shield 5. The conductive shield 5 is formed on the sealing layer 4. This forms the first shielding section 51 and second shielding section 52 that cover the outer surfaces of the sealing layer 4, and the third shielding section 53 disposed in the grooves 41.

In the present embodiment, the conductive shield 5 is formed by coating or filling a conductive resin or conductive coating material on the surface of the sealing layer 4. The forming method has no particular limitations, and it is possible to use a molding method, a potting method that does not use a mold, or the like, for example. Furthermore, a liquid or paste-like sealing resin material may be coated onto the sealing layer 4 via spin coating/screen printing and then cured via a thermal treatment, for example. Furthermore, in order to enhance filling efficiency of the conductive resin into the grooves 41, the step of forming the conductive shield may be performed in a vacuum.

The third shielding section 53 is filled into the grooves 41. This bonds the third shielding section 53 to the second metal layer 12 of the conductive pattern exposed at the bottom surface of the grooves 41. In the present embodiment, the first shielding section 51, second shielding section 52, and third shielding section 53 are each formed of the same material, thereby ensuring conductivity between the first shielding section 51 and third shielding section 53 and the desired bonding strength between both shielding sections 51 and 52.

The conductive resin that forms the second shielding section 52 is filled into the cutting grooves C formed in the sealing layer 4, thereby bonding the resin to the GND terminal 24*a* on the substrate 2 facing the cutting grooves C. This electrically and mechanically connects the second shielding section 52 to the GND terminal 24*a*.

Forming of the conductive shield 5 may be done by a vacuum deposition method such as plating or sputtering. In the case of the former, the aggregate substrate 25 is submerged into a plating solution and a plating film is caused to be deposited on the outer surfaces of the sealing layer 4 and the inner wall faces of the grooves 41, thereby making it possible to form the conductive shield 5. In the case of the latter, the aggregate substrate 25 is loaded into a vacuum chamber and a target made of a conductive material is sputtered to deposit a film on the outer surfaces of the sealing layer 4 and inner wall faces of the grooves 41, thereby making it possible to form the conductive shield 5. In such a case, it is not necessary to fill the inside of the grooves 41 with plating film or sputtering film.

(Cutting)

Figure 10A:
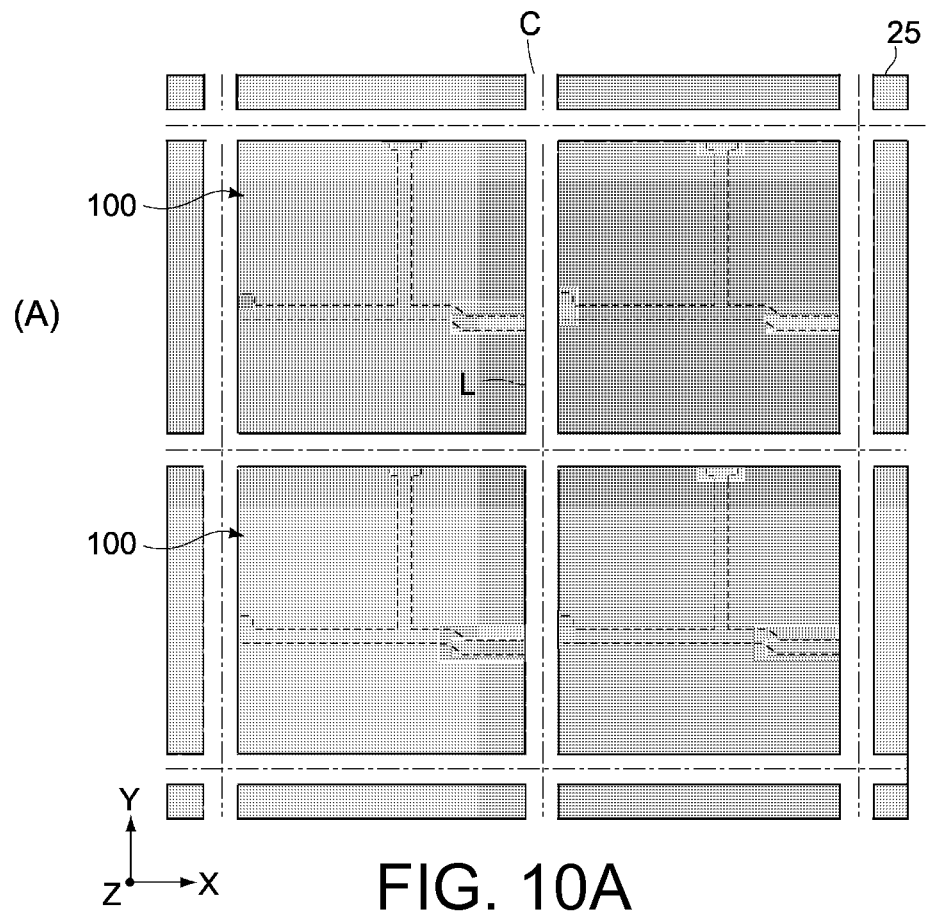
FIGS. 10A and 10B are views that illustrate the method for manufacturing the circuit module.
Figure 10B:
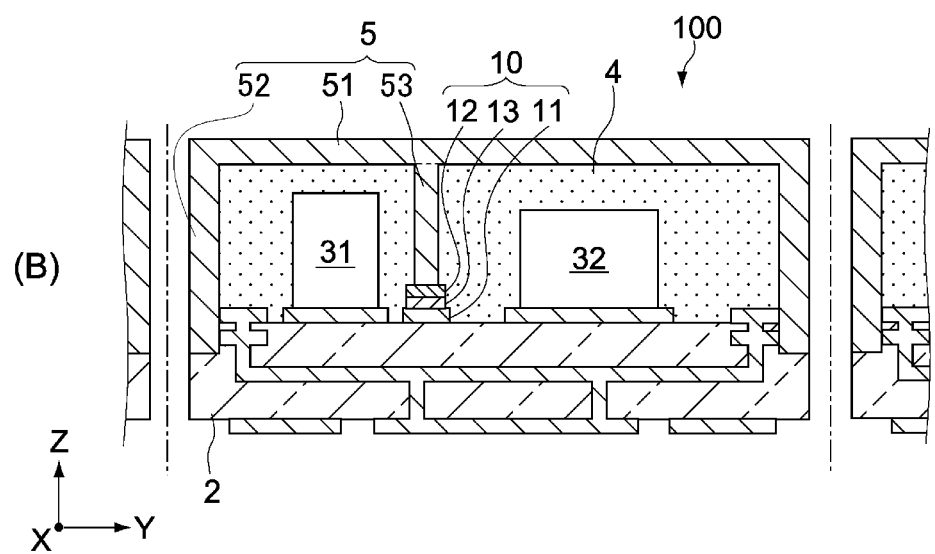

FIGS. 10A and 10B are views for explaining the cutting step. In the cutting step, the aggregate substrate 25 is full-cut along the dividing lines L to create a plurality of the circuit modules 100. A dicer or the like is used for the dividing, for example. In the present embodiment, the conductive shield 5 is filled into the cutting grooves C; thus, when dividing along the dividing lines L, the wiring substrates 2 and the second shielding section 52 have the same cutting surface. This fabricates the circuit modules 100, which each have the conductive shield 5 covering the surfaces (top and sides) of the sealing layer 4 and a portion of the side faces of the wiring substrate 2.

(Effects of Present Embodiment)

The steps described above manufacture the circuit module 100. The method of manufacturing the circuit module according to the present embodiment makes it possible to manufacture the circuit module 100 having the conductive shield 5, which has the first shielding section 51 and second shielding section 52 that prevent leakage of electromagnetic waves to outside the module and infiltration of electromagnetic waves to inside the module, and a third shielding section 53 that prevents electromagnetic interference among the plurality of electronic components in the module.

Furthermore, according to the present embodiment, a laser processing method is used for forming the grooves 41 in the sealing layer 4 where the third shielding section 53 is provided; thus, the grooves 41 can be formed to have any shape (bent, jigsawed, curved, etc.) as compared to if the grooves were formed with dicing. This enhances the design freedom of the third shielding section 53.

In addition, when using laser-cutting to form grooves in the sealing layer, it is ordinarily markedly difficult to adjust the laser power to an optimum level for reliably processing the resin without damaging the wiring patterns at the bottom of the grooves. Moreover, smears (residuals of resins, fillers or the like) ordinarily remain in the bottom of the grooves and must be removed by an additional desmear process. The desmear process normally includes physical removal of the smears through dry etching or chemical removal through a strong alkaline chemical solution or the like, but is more difficult the larger the aspect ratio (width/depth) of the grooves. Therefore, there are cases in which, even if the conductive resin is filled into the grooves, the electrical connection to the wiring patterns directly therebelow is damaged, which makes it impossible to ensure favorable shielding performance.

As a countermeasure, in the present embodiment, the topmost layer of the conductive pattern 10 that leads the third shielding section 53 to the GND terminal is made of an Au or Ag layer (second metal layer 12) having a relatively high reflectance with respect to the laser beam. Thus, even if the laser power is too high, burning of the conductive pattern 10 can be prevented, which makes it possible to alleviate the control management burden for the laser power and to improve operability and productivity. Furthermore, even if processing is performed under excessive parameters whereby no smear is left on the bottom of the grooves, the first metal layer 11 can be protected from radiation from the laser. Moreover, even if the second metal layer 12 is burned, the third metal layer 13 protects the first metal layer 11. This can ensure conductivity between the third shielding section 53 provided in the grooves 41 and the first metal layer 11 and allow the laser beam to form stably and easily the grooves 41 without burning out the first metal layer 11.

In addition, in the present embodiment, laser processing is used to form the grooves 41, which allows for a higher depth precision than if the grooves were formed by dicing. The second metal layer 12, which is the topmost layer of the conductive pattern 10, is made of Au or Ag that has high reflectance characteristics with respect to the laser beam; thus, the first metal layer 11 is effectively protected from laser damage, and even if the second metal layer 12 is severed by being irradiated by the laser, the third metal layer 13, which is more resistant to heat than the first metal layer 11, can protect the first metal layer 11. In this manner, the present embodiment allows the conductive pattern 10 to be formed directly below the grooves 41, which makes it possible to provide a circuit module 100 having a high degree of wiring design freedom.

Embodiments of the present invention were described above, but the present invention is not limited to these embodiments, and various modifications can be made in accordance with the technical spirit of the invention.

In the present embodiment, for example, an example was described in which the wiring substrates 2 are formed of printed wiring substrates, but the present invention is not limited to this, and, in one aspect, the wiring substrates may be formed of a semiconductor substrate such as a silicon substrate, for example. Furthermore, the electronic components may be various types of actuators such as MEMS (microelectromechanical system) components.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A circuit module, comprising:
   a substrate having a plurality of electronic components mounted thereon, said substrate further having a conductive pattern that defines respective shielded areas where the electronic components are mounted;
   a sealing layer covering the substrate and the electronic components, said sealing layer having grooves formed therein along said conductive pattern; and
   a conductive shield, including:
      a first shielding section covering a top surface of the sealing layer;
      a second shielding section covering side faces of the sealing layer; and
      a third shielding section filling the grooves in the sealing layer,
   wherein the grooves in the sealing layer are shaped such that the third shielding section has at least one end thereof connected to the second shielding section, the third shielding section thereby acting as shielding walls partitioning the respective shielded areas, and that said at least one end of the third shielding section has a width wider than other portions of the third shielding section.

2. The circuit module according to claim 1, wherein said at least one end of the third shielding section is bent into an "L" shape.

3. The circuit module according to claim 1, wherein said at least one end of the third shielding section is bent into a "T" shape.

4. The circuit module according to claim 1, wherein said at least one end of the third shielding section is bent into an elliptical shape or semi-circular shape.

5. A method of manufacturing a circuit module, comprising:
   preparing a substrate having a plurality of electronic components mounted thereon, said substrate further having a conductive pattern that defines respective shielded areas where the electronic components are mounted,
   forming a sealing layer so as to cover the substrate and the electronic components;
   forming, along the conductive pattern, grooves in the sealing layer having a depth that reaches the conductive pattern by irradiating a surface of said sealing layer with a laser beam; and
   thereafter, applying a conductive resin on the sealing layer so as to form:
      a first shielding section made of the conductive resin, covering a top surface of the sealing layer;
      a second shielding section made of the conductive resin, covering side faces of the sealing layer; and
      a third shielding section made of the conductive resin, filling the grooves in the sealing layer,
   wherein in the step of forming the grooves, the grooves are shaped such that the third shielding section that fills the grooves has at least one end thereof connected to the second shielding section, the third shielding section thereby acting as shielding walls partitioning the respective shielded areas, and that said at least one end of the third shielding section has a width wider than other portions of the third shielding section.

* * * * *